United States Patent [19]

Kishi et al.

[11] 4,419,541
[45] Dec. 6, 1983

[54] PULSIVE NOISE REMOVING APPARATUS

[75] Inventors: Hiroyasu Kishi, Gunma; Junji Sakamoto; Sadao Kondou, both of Oota, all of Japan

[73] Assignees: Sanyo Electric Co., Ltd., Moriguchi; Tokyo Sanyo Electric Co., Ltd., Gunma, both of Japan

[21] Appl. No.: 329,726

[22] Filed: Dec. 11, 1981

[30] Foreign Application Priority Data

Jan. 20, 1981 [JP] Japan .................................. 56/7465

[51] Int. Cl.³ ............................................. H04H 5/00
[52] U.S. Cl. ...................................... 381/7; 455/223; 381/13
[58] Field of Search ....................... 455/212, 223, 296; 179/1 GD, 1 GB

[56] References Cited

U.S. PATENT DOCUMENTS

| | | | |
|---|---|---|---|
| 4,066,845 | 1/1978 | Kishi | 179/1 GD |
| 4,207,432 | 6/1980 | Amazawa et al. | 179/1 GD |
| 4,221,928 | 9/1980 | Franssen et al. | 179/1 GD X |
| 4,246,441 | 1/1981 | Sugai et al. | 179/1 GD |
| 4,306,112 | 12/1981 | Ueno | 179/1 GD |

OTHER PUBLICATIONS

European Patent Application Publication No. 0018608; Saol; Nov. 1980.

*Primary Examiner*—R. J. Hickey
*Attorney, Agent, or Firm*—Darby & Darby

[57] ABSTRACT

A pulsive noise removing apparatus comprises a subtracting circuit (35) receiving one input thereto a stereo composite signal directly from a delay circuit (31). A stereo switching signal is generated as a function of a stereo pilot signal included in the stereo composite signal and a cancel signal of the same level, the same frequency and the same phase as those of the stereo pilot signal is generated as a function of the stereo switching signal. A gate (67) is interposed between the output of the cancel signal generating circuit (65) and the other input of the subtracting circuit and the gate is interrupted responsive to detection of a pulsive noise included in the composite signal. The pulsive noise is removed due to interruption of the gate and the stereo pilot signal is prevented from appearing at the output of the subtracting circuit irrespective of conduction or interruption of the gate.

9 Claims, 7 Drawing Figures (A) COMPOSITE SIGNAL AT "A"

(B) PILOT CANCELLATION SIGNAL AT "B"

(C) MINUS INPUT SIGNAL AT "C"

(D) OUTPUT SIGNAL AT "D"

(E) GATE CONTROL PULSE AT "E"

PULSIVE NOISE REMOVING APPARATUS

BACKGROUND OF THE INVENTION

1. Field of the Invention

The present invention generally relates to a pulsive noise removing apparatus. More specifically, the present invention relates to a pulsive noise removing apparatus such as employed in an FM stereo receiver, for example, for removing a pulsive noise included in a stereo composite signal and for preventing a stereo pilot signal from being applied to a stereo demodulating circuit.

2. Description of the Prior Art

It is well-known that a pulsive noise such as a motor noise, an ignition noise generated by an automobile or the like could exert an influence upon normal reception by an FM receiver. Since such pulsive noise phase modulates the FM signal, the pulsive noise cannot be removed even by a limiter. Furthermore, since the frequency spectrum of such pulsive noise is distributed throughout a wide range from a low frequency to a high frequency, the same cannot be removed even by employment of a filter. Accordingly, a particular circuit for removing such pulsive noise has already been proposed and put into practical use.

FIG. 1 is a block diagram showing one example of an FM stereo receiver which constitutes the background of the invention. An FM stereo receiver comprises an antenna 1 for receiving FM broadcasting, a high frequency amplifier 3 for amplifying an FM signal received by the antenna 1, a local oscillator 5 for generating a local oscillation signal, a mixer 7 for mixing the amplified high frequency signal obtained from the high frequency amplifier 3 and the local oscillation signal obtained from the local oscillator 5 for converting the high frequency signal into an intermediate frequency signal, an intermediate frequency amplifier 9 for amplifying the intermediate frequency signal, and an FM detector 11 for demodulating the intermediate frequency signal amplified by the intermediate frequency amplifier 9 for providing a stereo composite signal. The stereo composite signal obtained from the FM detector 11 is applied to a stereo demodulating circuit 15 through a noise removing circuit 13. The stereo demodulating circuit 15 demodulates the stereo composite signal to provide a left signal and a right signal, which are applied to low frequency amplifiers 17 and 19. Speakers 21 and 23 are driven with the outputs from the low frequency amplifiers 17 and 19. The present invention is directed to an improvement in a pulsive noise removing apparatus such as inserted between the FM detector and the stereo demodulating circuit, as shown in FIG. 1.

One example of such pulsive noise removing apparatus is disclosed in Japanese Patent Publication No. 15710/1964 published for opposition Aug. 5, 1964, for example. The apparatus disclosed in the reference patent publication comprises a gate in a signal transfer path, which gate is interrupted for a given time period responsive to detection of a pulsive noise, whereby a pulsive noise is prevented from passing through the signal transfer path. A capacitor is also connected to the output point of the gate for the purpose of holding a level. The capacitor serves to maintain the level of a signal immediately before the gate is interrupted, whereby the signal is compensated with the signal maintained in the capacitor when the gate is interrupted. The pulsive noise is thus removed and distance of the signal during the gate interruption period is minimized. However, the above referenced Japanese Patent Publication No. 15710/1964 involves a problem that a stereo pilot signal is lost when the same is employed in an FM stereo receiver.

A pulsive noise removing apparatus which can prevent loss of a stereo pilot signal and can advantageously remove a pulsive noise has been proposed. One example is disclosed in U.S. Pat. No. 3,739,285 issued June 12, 1973. The apparatus disclosed in the referenced U.S. patent also comprises such gate and capacitor as described previously and a parallel resonance circuit is connected between the capacitor and the ground. The parallel resonance frequency of the parallel resonance circuit is selected to be the frequency of the pilot signal of the FM stereo broadcasting, say 19 kHz. Accordingly, the signal level immediately before the gate is interrupted is maintained in the capacitor and the pilot signal obtained from the parallel resonance circuit is applied to the stereo demodulating circuit. Thus, when the pulsive noise is detected, the gate is interrupted and the pulsive noise is prevented from being applied to the stereo demodulating circuit. Furthermore, when the gate is again closed, the continuity of the signal is maintained, inasmuch as the signal level has been maintained in the capacitor. At the same time, the pilot signal for the stereo demodulating circuit is prevented from being lost. Although the referenced United States patent can be advantageously utilized in an FM stereo receiver, still a further problem as set forth in the following is involved. More specifically, another series resonance circuit is formed with the capacitor and the parallel resonance circuit, whereby the signal being applied to the stereo demodulating circuit gives rise to distortion with such series resonance frequency. The series resonance frequency is necessarily smaller than the parallel resonance frequency and accordingly the same in an audible region and the distortion is outputted as a sound.

Therefore, the same assignee as the present invention previously proposed a noise removing apparatus directed to an improvement over the above referenced U.S. Pat. No. 3,739,285 and U.S. Pat. No. 4,066,845 issued Jan. 3, 1978 on the above described improvement. The last referenced U.S. patent teaches that an oscillation circuit is provided so that a stereo pilot signal is prevented by the oscillation circuit from being lost during the interruption period of the gate. A further pulsive noise removing apparatus is disclosed in Japanese Utility Model Laying-Open No. 106608/1978 laid-open Aug. 26, 1978. The referenced Japanese utility model laying-open discloses that a trap circuit is provided to a combination of the gate and capacitor so that the stereo pilot signal is removed by the trap circuit. Accordingly, a problem of losing the stereo pilot signal is eliminated; however, the interruption period of the gate is necessarily prolonged by the trap circuit, whereby discontinuity of the stereo composite signal is increased.

The same assignee as the present invention further proposed an improved noise removing apparatus in U.S. patent application, Ser. No. 133,932 and European patent application No. 80102251.8 (European Patent Publication No. 0018608). The last mentioned noise removing apparatus comprises two sets of a combination of a gate and a capacitor for maintaining the level. One of the gates receives a stereo composite signal, while the other receives a pseudo-pilot signal, and both are interrupted responsive to detection of a pulsive noise included in a composite signal. The outputs from the gate are applied to a signal synthesizing circuit such as an adding or subtracting circuit, for example. If and when a pulsive noise is included in the composite signal, the first gate is interrupted, whereby the pulsive noise is prevented from being applied to the adding or subtracting circuit, while the second gate is interrupted and the pseudo-pilot signal is also prevented from being applied to the adding or subtracting circuit. Accordingly, the signal maintained in the corresponding capacitor during the interruption period of the first and second gates is applied to the two inputs of the adding or subtracting circuit, whereby the stereo pilot signal is prevented from being obtained from the adding or subtracting circuit for that period. Meanwhile, when the first and second gates are rendered conductive, the stereo pilot signal is removed with the adding or subtracting circuit. In other words, the proposed noise removing apparatus simultaneously performs removal of a pulsive noise and cancellation of the pilot signal. Accordingly, an adverse influence upon the stereo pilot signal in the stereo demodulating circuit can be completely eliminated in an FM stereo receiver.

However, the proposed noise removing apparatus necessitates a combination of two sets of gates and capacitors, which makes complicated a circuit structure. In addition, since the signals from the two sets of circuits are utilized for offsetting the stereo pilot signals upon addition or subtraction thereof, both need have the same characteristics. Accordingly, diversification of the characteristics and capacitances of the transistors and capacitors constituting the two sets of circuits must be minimized and accordingly mass productivity is poor.

Furthermore, any of the above described prior art circuits comprises a gate implemented by a transistor, for example, in a transfer path of a stereo composite signal. Insertion of a gate in the signal path is one of the causes giving rise to distortion in the composite signal. The reason is that a transistor constituting the gate is not a completely linear device and hence involves non-linear portion. Accordingly, an apparatus including a gate inserted in the signal path necessitates another means for removing distortion caused by such non-linear portion. Without any means for removing such distortion, it becomes necessary not to insert a gate in a signal path; however, any apparatus of such structure which simultaneously performs removal of a pulsive noise and cancellation of pilot signal has not yet been proposed.

SUMMARY OF THE INVENTION

A pulsive noise removing apparatus in accordance with the present invention performs removal of a pulsive noise and removal of a reference signal such as a pilot signal. The present invention comprises a subtracting circuit having two inputs, with an electric charge storing device such as a capacitor connected between the two inputs of the subtracting circuit. One input of the subtracting circuit is supplied with a composite signal directly; the other input of the subtracting circuit is supplied with a cancel signal for cancelling the reference signal through a gate. The output voltage of the subtracting circuit is a difference voltage of the two inputs and the same is equal to the terminal voltage of the electric charge storing device. When the gate for the cancel signal is rendered conductive, one input of the subtracting circuit is supplied with the composite signal and the other input of the subtracting circuit is supplied with the cancel signal, whereby only an information signal such as a sound signal with the reference signal such as the pilot signal removal is obtained as the output of the subtracting circuit. When the gate is interrupted responsive to detection of the pulsive noise, the electric charge storing device can be deemed in a short-circuited state in terms of the alternating current and therefore the signal waveforms being applied to the two inputs of the subtracting circuit become the same. Accordingly, when a pulsive noise is included in the composite signal, the pulsive noise appears not only at one input but also at the other input. Therefore, the pulsive noise is cancelled in the subtracting circuit and only the voltage maintained by the electric charge storing device appears at the output thereof. The voltage from the electric charge storing device is the terminal voltage immediately before the gate is interrupted and accordingly no reference signal is included therein.

According to the present invention, a pulsive noise removing apparatus performing removal of a pulsive noise and cancellation of a reference signal such as a pilot signal is provided with a simple circuit structure. In addition, since no such gate as implemented by a non-linear device such as a transistor is inserted in a transfer path of the composite signal, no distortion is caused in the composite signal due to such non-linear device. Such respect is entirely different from any of the previously described prior art apparatuses.

In a preferred embodiment of the present invention, such pulsive noise removing apparatus as described above is applied in an FM stereo receiver and such FM stereo receiver comprises a switching signal generating circuit for generating a switching signal for stereo demodulation responsive to a stereo pilot signal included in a composite signal and therefore the above described cancel signal is generated based on the output from the switching signal generating circuit. Accordingly, any particular circuit need not be provided for the purpose of generating the cancel signal.

In another preferred embodiment of the present invention, means is provided for compensating a signal component associated with a subcarrier in addition to provision of an electric charge storing device such as a capacitor between the two inputs of a subtracting circuit. One example of such compensating means comprises an LC parallel resonance circuit the parallel resonance frequency of which is selected in association with the frequency of the subcarrier. According to the embodiment, no disturbance of the subcarrier associated signal is caused and hence a stereo receiver of a better characteristic is provided.

Accordingly, a principal object of the present invention is to provide a pulsive noise removing apparatus that can perform removal of a pulsive noise and cancellation of a reference signal with a simple circuit structure and with a better characteristic.

One aspect of the present invention resides in a pulsive noise removing apparatus without interposition of a gate implemented by a non-linear device in a path of the composite signal.

Another aspect of the present invention resides in a pulsive noise removing apparatus suited for an FM stereo receiver.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
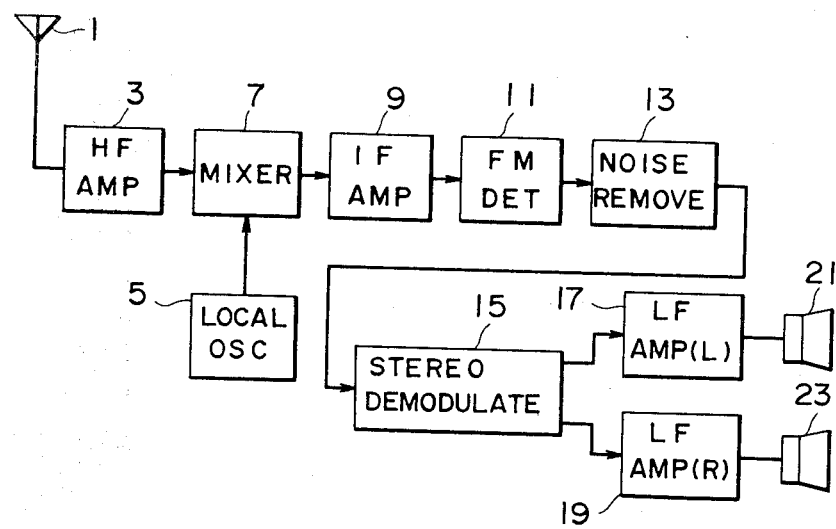
FIG. 1 is a block diagram showing one example of an FM stereo receiver which constitutes the background of the invention.
Figure 2:
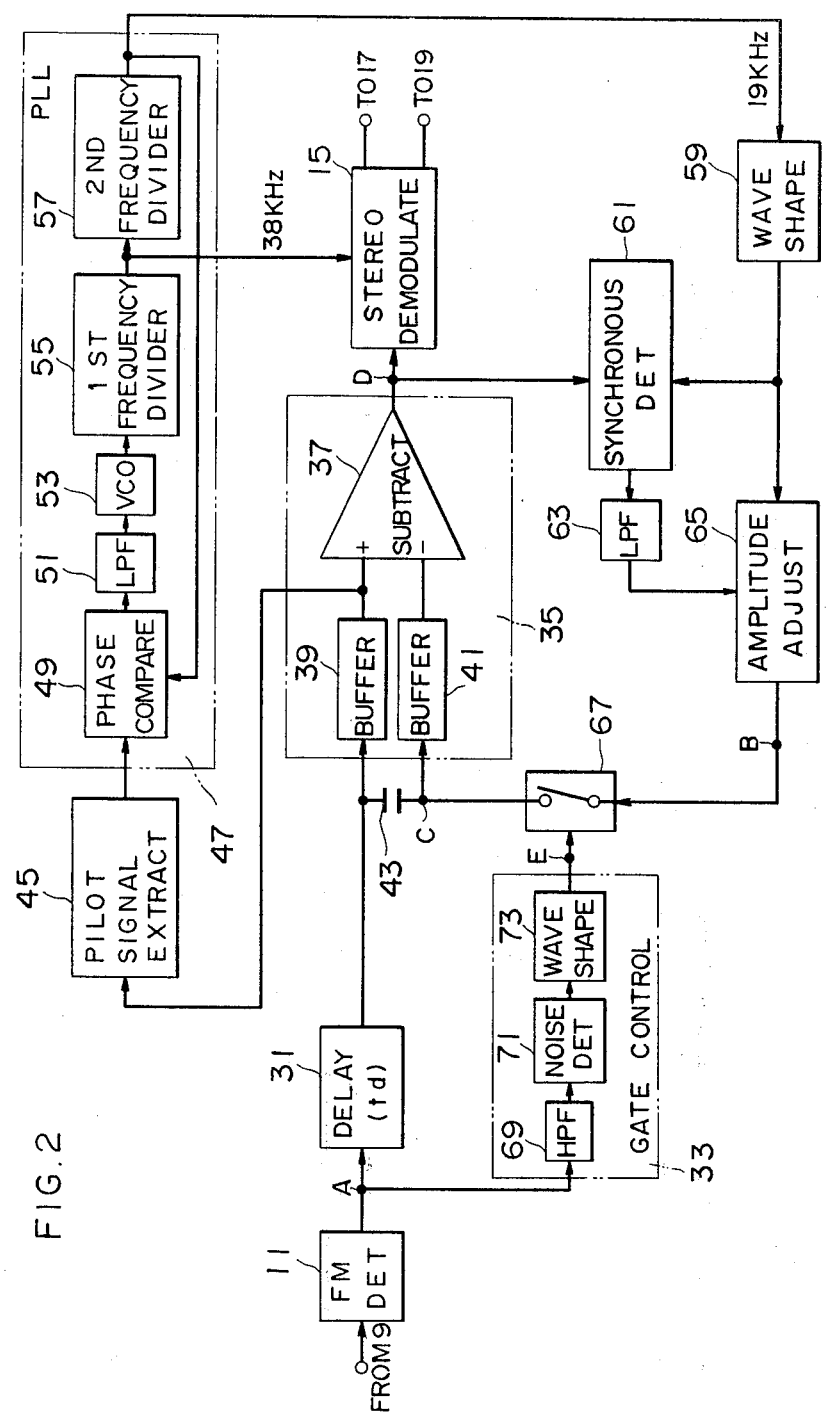
FIG. 2 is a block diagram showing one embodiment of the present invention.
Figure 4:
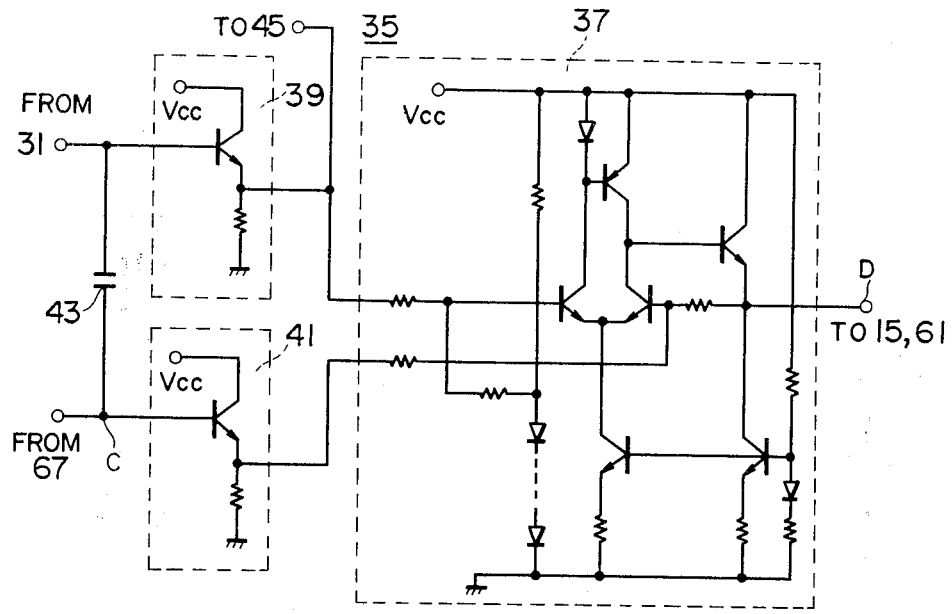
FIG. 4 is a schematic diagram showing a preferred embodiment of a subtracting circuit for use in the FIG. 2 embodiment.

FIG. 2 is a block diagram showing one embodiment of the present invention. The FM detector 11 receives the output of the intermediate frequency amplifier 9 in the same manner as that in FIG. 1 and the detected output, i.e. a stereo composite signal is applied to a delay circuit 31 and a gate control circuit 33. The delay circuit 31 serves to delay the received stereo composite signal for a predetermined time period (td) and the delayed composite signal is applied directly to one input, i.e. a plus input, of a subtracting circuit 35. The subtracting circuit 35 comprises a subtracter 37 and buffer circuits 39 and 41 connected to the two inputs of the subtracter 37. Accordingly, the input of the buffer circuit 39 becomes the plus input of the subtracting circuit 35 and the input of the buffer circuit 41 becomes the minus input of the subtracting circuit 35. The subtracter 37 and the buffer circuits 39 and 41 constituting the subtracting circuit 35 are shown in more detail in FIG. 4. The buffer circuits 39 and 41 each comprises an emitter follower and accordingly the plus input and the minus input of the subtracting circuit 35 both exhibit a very large input impedance. An electric charge storing device or a capacitor 43 is connected between the plus input and the minus input of the subtracting circuit 35. Since the output of the subtracting circuit 35 is a difference voltage between the plus input and the minus input, the same becomes equal to the terminal voltage of the capacitor 43. The output of the subtracting circuit 35 is applied to the stereo demodulating circuit 15.

Figure 5:
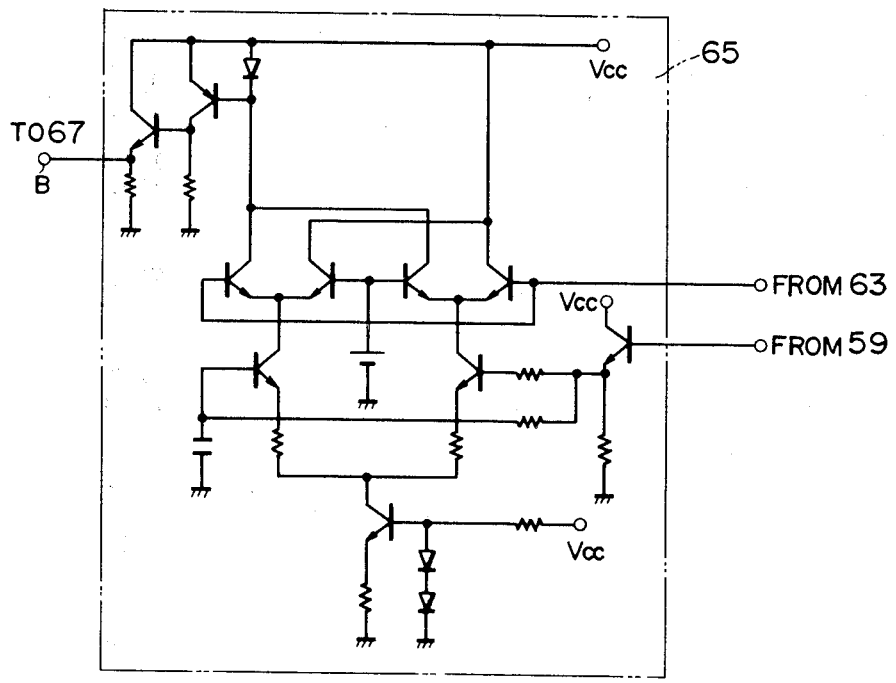
FIG. 5 is a schematic diagram showing a preferred embodiment of an amplitude adjusting circuit for use in the FIG. 2 embodiment.

The composite signal that passed the buffer circuit 39 is further applied to a pilot signal extracting circuit 45. The circuit 45 serves to extract a reference signal, i.e. a pilot signal from the composite signal and the extracted output is applied to a phase locked loop 47. The phase locked loop 47 serves to generate a switching signal of 38 kHz in synchronism with the pilot signal (19 kHz). The phase locked loop 47 comprises a phase comparator 49, a low-pass filter 51, a voltage controlled oscillator 53 and two frequency dividers 55 and 57, as well-known. The output of the first frequency divider is applied to the stereo demodulating circuit 15 as a stereo switching signal of 38 kHz and is also applied to the second frequency divider 57. The output of the second frequency divider 57 is 19 kHz and a cancel signal to be described subsequently is generated based on the output of the second frequency divider 57. More specifically, the output of the second frequency divider 57 is applied to a wave shaping circuit 59. The wave shaping circuit 59 serves to convert the signal of 19 kHz from the second frequency divider 57 to a signal of a triangle wave, a trapezoidal wave or a sine wave, for example. The signal of 19 kHz from the wave shaping circuit 59 is applied to a synchronous detecting circuit 61 and is also applied to an amplitude adjusting circuit 47. The synchronous detecting circuit 61 is supplied with the output from the subtracting circuit 39, i.e. a low frequency signal. The synchronous detecting circuit 61 synchronous detects the signal applied to the input of the stereo demodulating circuit 15 with the output signal of the waveform shaping circuit 59 and provides at the output terminal thereof a signal associated with the magnitude of the stereo pilot signal remaining at the input terminal of the stereo demodulating circuit 15. The output of the synchronous detecting circuit 61 is converted into a direct current voltage by means of a low-pass filter 63. More specifically, the output from the low-pass filter 63 turns to a direct current voltage of a level associated with the magnitude of the stereo pilot signal remaining at the output terminal of the subtracting circuit 35. The direct current voltage from the low-pass filter 63 is applied to the amplitude adjusting circuit 65 has a control input. Specifically, the amplitude adjusting circuit 65 has a circuit structure as shown in FIG. 5, for example. Accordingly, the output impedance at the output stage of the amplitude adjusting circuit 65 is extremely small. Thus, a cancel signal of the same frequency and phase as those of the stereo pilot signal included in the composite signal is obtained from the amplitude adjusting circuit 65. The cancel signal is applied through the gate circuit 67 to the minus input of the subtracting circuit 35.

The gate circuit 67 is controlled by the gate control circuit 33. The gate control circuit comprises a high-pass filter 69, a noise detector 71 and a waveform shaping circuit 73. The high-pass filter 69 extracts only a high frequency component from the composite signal. The noise detector 71 provides to the wave shaping circuit 73 the detected output when the level of the high frequency signal as extracted exceeds a predetermined value. The wave shaping circuit 73 comprises a monostable multivibrator, for example, and is triggered with a noise detecting signal, thereby to provide a pulse of a predetermined time duration to the gate circuit 67 as a gate control signal. Accordingly, the gate circuit 67 is responsive to the control signal from the gate control circuit 33 to be interrupted for that period, thereby to prevent transfer of the cancel signal from the amplitude adjusting circuit 65 to the minus input of the subtracting circuit 35.

Meanwhile, of those circuits shown in FIG. 2, the subtracting circuit 35, the waveform shaping circuit 59, the synchronous detecting circuit 61, the low-pass filter 63 and the amplitude adjusting circuit 65 are disclosed in detail in European Patent Publication No. 0018608. Accordingly, the above described European patent publication is incorporated by reference thereto and any detailed description of these circuits will be omitted.

Figure 3:
FIG. 3 is a graph showing waveforms for explaining the operation of the FIG. 2 embodiment.
Figure 3:
Figure 3:
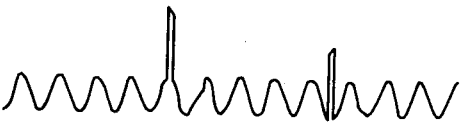
Figure 3:
Figure 3:

Now referring to FIG. 3, an operation of the FIG. 2 embodiment will be described. Referring to FIG. 3, (A) shows a composite signal at the output point A of the FM detecting circuit 11, (B) shows a cancel signal at the output point B of the amplitude adjusting circuit 65, (C) shows a signal at the minus input point C of the subtracting circuit 35, (D) shows a signal at the output point D of the subtracting circuit 35, and (E) shows a gate control pulse at the output point E of the gate control circuit 33.

First an operation in the case where no pulsive noise is included in the composite signal will be described. In such a case, no gate control pulse is obtained from the gate control circuit 33 and accordingly the gate circuit 67 is in a conductive state. Therefore, the cancel signal from the amplitude adjusting circuit 65 is applied through the gate circuit 67 to the minus input of the subtracting circuit 35. On the other hand, the composite signal from the delay circuit 31 is applied to the plus input of the subtracting circuit 35. The composite signal is represented as VL+VP in brief, where VL is a low frequency signal and VP is a stereo pilot signal while a subcarrier is omitted. Assuming the cancel signal to be VC, the output voltage Vout given by the following equation (1) is obtained at the output of the subtracting circuit 35, $$V_{out} = VL + VP - VC \ldots \quad (1)$$

where the cancel signal VC has the same amplitude and the same frequency and the same phase as those of the pilot signal VP and accordingly VP=VC. Therefore, the output signal of the subtracting circuit 35 becomes VL, i.e. only a low frequency signal. Thus, removal of a pilot signal is achieved. More specifically, the pilot signal included in the composite signal is canceled as a function of the cancel signal by means of the subtracting circuit 35 and hence only a low frequency signal appears at the output of the subtracting circuit 35. At that time the terminal voltage of the capacitor 43 also is a difference voltage between the composite signal and the cancel signal, i.e. a low frequency signal. Meanwhile, as seen from the FIG. 5, the output impedance of the amplitude adjusting circuit 65 is small and therefore, when the gate circuit 67 is rendered conductive, the input impedance of the minus input of the subtracting circuit 35 is decreased irrespective of existence of the buffer 41. Accordingly, the input signal applied to the minus input point C of the subtracting circuit 35 through the capacitor 43 from the delay circuit 31 becomes an extremely small level enough to be negligible. Accordingly, substantially the cancel signal is only applied to the minus input.

Now an operation in the case where the pulsive noise superposed on the composite signal is described. In such a case, such pulsive noise is detected by the noise detector 71 and a gate control pulse is obtained from the gate control circuit 33, as shown as (E) in FIG. 3. Accordingly, the gate circuit 67 is interrupted. On the other hand, the composite signal from the FM detector 11 is delayed by a predetermined time period (td) by the delay circuit 31. Accordingly, the pulsive noise is applied to the subtracting circuit 35 for an interruption period of the gate circuit 67. When the gate circuit 67 is interrupted, the cancel signal from the amplitude adjusting circuit 65 is not applied to the minus input of the subtracting circuit 35 any more. Accordingly, the composite signal with a pulsive noise superposed from the delay circuit 31 is applied to both of the plus input and the minus input of the subtracting circuit 35. More specifically, in terms of the alternating current, the capacitor 43 can be deemed as in a short-circuited state, whereas when the gate circuit 67 is interrupted the subtracting circuit 35 is not subjected to any influence of a low output impedance of the amplitude adjusting circuit 65 at all, whereby the input impedance of the minus input becomes high. Accordingly, the signal waveforms at the plus input and the minus input of the subtracting circuit 35 become equal to each other as shown as (A) and (C) in FIG. 3, apart from the low frequency signal. Assuming a pulsive noise to be VN and a terminal voltage of the capacitor 43 to be VL1, then the signal Vplus applied to the plus input and the signal Vminus being applied to the minus input of the subtracting circuit 35 are expressed by the following equations (2) and (3), respectively.

$$V_{plus} = VL + VP + VN \ldots \quad (2)$$

$$V_{minus} = VL + VP + VN - VL1 \ldots \quad (3)$$

Accordingly, through subtraction of the signals represented by these two equations by the subtracting circuit 35, only the terminal voltage VL1 of the capacitor 43 is obtained at the output thereof. Since the voltage VL1 is the terminal voltage of the capacitor 43 immediately before the gate circuit 67 is interrupted, the same is only the low frequency signal immediately before the gate circuit 67 is interrupted. Since the input impedance of the subtracting circuit 35 is high, a charging/discharging current does not flow to or from the capacitor 43 during the time period when the gate circuit 67 is interrupted and accordingly the capacitor 43 can maintain the terminal voltage VL1. Thus, during the interruption period of the gate circuit 67, removal of the pulsive noise and cancellation of the stereo pilot signal are simultaneously performed, as shown as (D) in FIG. 3.

Figure 6:
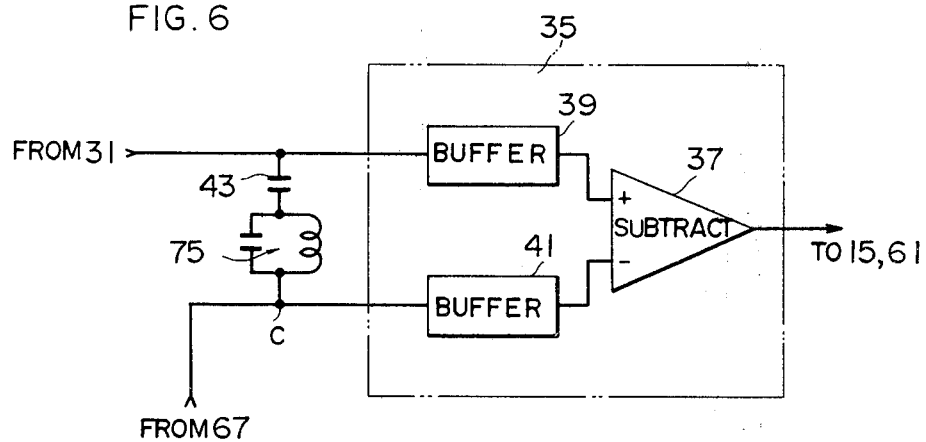
FIGS. 6 and 7 are schematic diagrams of major portions of modifications of the present invention, respectively.

FIG. 6 is a block diagram of a major portion of a modification of the FIG. 2 embodiment. In the embodiment shown, the capacitor 43 and an LC resonance circuit 75 are provided between the plus input and the minus input of the subtracting circuit 35. The resonance circuit 75 has the resonance frequency of 38 kHz, for example, which is the same frequency as that of the subcarrier of the FM stereo broadcasting. The resonance circuit 75 serves to compensate the signal level associated with the subcarrier. More specifically, since the resonance circuit 75 makes resonance at the frequency of 38 kHz, both the low freqency signal and the signal associated with the subcarrier are obtained at the output of the subtracting circuit 35.

Figure 7:
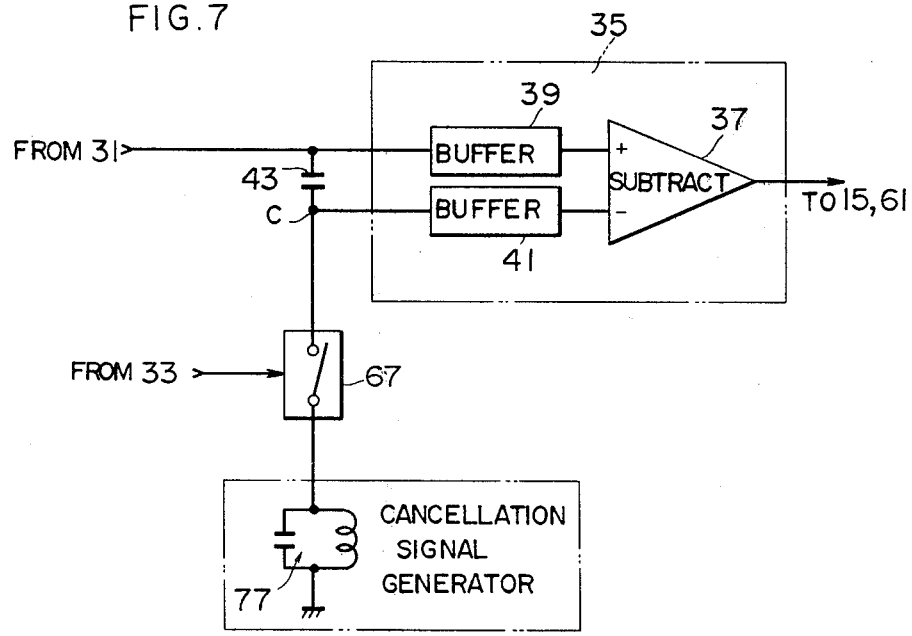

FIG. 7 is a block diagram showing a major portion of another embodiment of the present invention. The embodiment shown is particularly suited for an FM monaural receiver. More specifically, in the FIG. 2 embodiment, the switching signal was generated responsive to the pilot signal included in the stereo composite signal and the cancel signal was generated responsive to the switching signal. Since a monaural receiver need not comprise such a circuit for generating a switching signal, no cancel signal is generated with the same structure as that of the FIG. 2 embodiment. Therefore, as seen in the FIG. 7 embodiment, a parallel resonance circuit 77 making resonance to the frequency of 19 kHz is employed. The resonance circuit 77 functions as a cancel signal generator. More specifically, since the resonance circuit 77 makes resonance to the pilot signal (19 kHz) included in the composite signal, a cancel signal is obtained from the circuit 77 when the gate circuit 67 is rendered conductive. When the gate circuit 67 is interrupted, the same operation as that of the FIG. 2 embodiment is performed.

As described in the foregoing, according to the present invention, a pulsive noise can be effectively removed and an undersired reference signal such as a stereo pilot signal can also be effectively removed. In addition, according to the present invention, no gate circuit need be inserted in the transfer path of the composite signal and therefore no distortion occurs due to non-linearity of a device constituting the gate circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pulsive noise removing apparatus, comprising:
composite signal providing means for providing a composite signal including an information signal and a reference signal,
subtracting circuit means having two inputs and receiving said composite signal at one input thereto,
electric charge storing means coupled between said two inputs of said subtracting circuit means,
cancel signal generating means for generating a cancel signal for cancelling said reference signal upon application of said cancel signal to the other input of said subtracting circuit means,
noise detecting means for detecting a pulsive noise included in said composite signal, and
gate means interposed between said cancel signal generating means and said other input of said subtracting circuit means for being rendered conductive or interrupted responsive to said noise detecting means, whereby said gate means is interrupted upon detection of a pulsive noise for removing said pulsive noise and said information signal with said reference signal removed is obtained from said subtracting circuit means irrespective of conduction or interruption of said gate means.

2. A pulsive noise removing apparatus in accordance with claim 1, wherein
the input impedance of said subtracting circuit means is high and the output impedance of said cancel signal generating means is low, whereby said composite signal being applied to the other input of said subtracting circuit means through said electric charge storing means when said gate means is rendered conductive is extremely small.

3. A pulsive noise removing apparatus in accordance with claim 1 or 2, wherein
said composite signal is a demodulated signal of an FM stereo signal, said demodulated signal including a sound signal serving as said information signal and a stereo pilot signal serving as said reference signal, and which further comprises
switching signal generating means responsive to said stereo pilot signal included in said demodulated signal for generating a stereo switching signal, and
stereo demodulating means responsive to the output of said subtracting circuit means and said switching signal for demodulating a left signal and a right signal.

4. A pulsive noise removing apparatus in accordance with claim 3, wherein
said cancel signal generating means comprises means for generating said cancel signal by utilizing said switching signal obtained from said switching signal generating means.

5. A pulsive noise removing apparatus in accordance with claim 4, which further comprises
said cancel signal generating means comprises
waveform shaping means receiving the output of said means for generating said cancel signal for waveform shaping the same, and
amplitude adjusting means receiving the output from said waveform shaping means and responsive to the level of said stereo pilot signal remaining at the output of said subtracting circuit means for providing the output of the amplitude as adjusted as said cancel signal.

6. A pulsive noise removing apparatus in accordance with claim 3, wherein
said switching signal generating means comprises
pilot signal extracting means for extracting a stereo pilot signal from said demodulated signal, and
phase locked loop means responsive to said stereo pilot signal extracted by said pilot signal extracting means.

7. A pulsive noise removing apparatus in accordance with claim 1, which further comprises
delay means interposed between said composite signal providing means and said one input of said subtracting circuit means,
said noise detecting means receiving said composite signal from the preceding stage of said delay means for detecting a pulsive noise in superposition on said composite signal.

8. A pulsive noise removing apparatus in accordance with claim 3, wherein
said FM stereo signal includes subcarrier, and which further comprises
subcarrier compensating means coupled between said two inputs of said subtracting circuit means together with said electric charge storing means for compensating said subcarrier.

9. A pulsive noise removing apparatus in accordance with claim 8, wherein
said subcarrier compensating means comprises an LC parallel resonance circuit the parallel resonance frequency of which is selected in association with the frequency of said subcarrier.

* * * * *